United States Patent
Toh et al.

(10) Patent No.: US 9,312,268 B2
(45) Date of Patent: Apr. 12, 2016

(54) INTEGRATED CIRCUITS WITH FINFET NONVOLATILE MEMORY

(71) Applicant: GLOBALFOUNDRIES Singapore Pte. Ltd., Singapore (SG)

(72) Inventors: Eng Huat Toh, Singapore (SG); Shyue Seng Jason Tan, Singapore (SG); Elgin Kiok Boone Quek, Singapore (SG); Danny Shum, Caspian (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/474,578

(22) Filed: Sep. 2, 2014

(65) Prior Publication Data

US 2016/0064398 A1  Mar. 3, 2016

(51) Int. Cl.

| | |
|---|---|
| *H01L 21/00* | (2006.01) |
| *H01L 21/84* | (2006.01) |
| *H01L 21/33* | (2006.01) |
| *H01L 27/115* | (2006.01) |
| *H01L 29/78* | (2006.01) |
| *H01L 29/788* | (2006.01) |
| *H01L 29/66* | (2006.01) |

(52) U.S. Cl.
CPC .... *H01L 27/11524* (2013.01); *H01L 27/11546* (2013.01); *H01L 27/11548* (2013.01); *H01L 29/66795* (2013.01); *H01L 29/66825* (2013.01); *H01L 29/785* (2013.01); *H01L 29/788* (2013.01)

(58) Field of Classification Search
CPC ......... H01L 21/70; H01L 21/02; H01L 21/28; H01L 21/33; H01L 21/32; H01L 27/11
USPC ........... 438/157, 257; 257/314–316, 213, 324
See application file for complete search history.

(56) References Cited

U.S. PATENT DOCUMENTS

| | | | | |
|---|---|---|---|---|
| 2004/0004863 | A1* | 1/2004 | Wang | H01L 27/115 365/199 |
| 2004/0099885 | A1* | 5/2004 | Yeo | H01L 27/11 257/208 |
| 2004/0266077 | A1* | 12/2004 | Yeo | H01L 29/785 438/157 |
| 2005/0145926 | A1* | 7/2005 | Lee | B82Y 10/00 257/316 |
| 2006/0163643 | A1* | 7/2006 | Ufert | H01L 21/28273 257/315 |
| 2007/0090443 | A1* | 4/2007 | Choi | H01L 21/84 257/314 |
| 2007/0210338 | A1* | 9/2007 | Orlowski | H01L 29/66825 257/213 |
| 2007/0290223 | A1* | 12/2007 | Yagishita | H01L 21/84 257/103 |
| 2008/0116508 | A1* | 5/2008 | Hayashi | H01L 21/28282 257/324 |
| 2009/0108322 | A1* | 4/2009 | Widjaja | G11C 11/404 257/314 |
| 2011/0163369 | A1* | 7/2011 | Xiao | H01L 21/28273 257/321 |
| 2013/0334588 | A1* | 12/2013 | Chen | H01L 29/66795 257/324 |

* cited by examiner

*Primary Examiner* — Jessica Stultz
*Assistant Examiner* — Sheikh Maruf
(74) *Attorney, Agent, or Firm* — Ingrassia Fisher & Lorenz, P.C.

(57) ABSTRACT

Integrated circuits and methods for producing the same are provided. A method for producing an integrated circuit includes forming a first and second fin overlying a substrate, where the first and second fins intersect at a fin intersection. The first fin has a first fin left end. A tunnel dielectric and a floating gate are formed adjacent to the first fin with the tunnel dielectric between the floating gate and the first fin. An interpoly dielectric is formed adjacent to the floating gate, and a control gate is formed adjacent to the interpoly dielectric such that the interpoly dielectric is between the floating gate and the control gate. The control gate, interpoly dielectric, floating gate, and the tunnel dielectric are removed from over the first fin except for at a floating gate position between the first fin left end and the fin intersection.

19 Claims, 12 Drawing Sheets

INTEGRATED CIRCUITS WITH FINFET NONVOLATILE MEMORY

TECHNICAL FIELD

The technical field generally relates to integrated circuits and methods for producing integrated circuits, and more particularly relates to integrated circuits with nonvolatile memory on FinFET and methods for producing such integrated circuits.

BACKGROUND

The semiconductor industry is continuously moving toward the fabrication of smaller and more complex microelectronic components with higher performance. Memory cells are an important part of many microelectronic components, and smaller and more reliable memory cells are desirable. One type of memory cell is flash memory that is non-volatile and re-writable. Non-volatile memory retains stored information even when the memory cell is de-powered, and stored information can be changed when a memory cell is re-writable. Some memory cells for flash memory store information by either charging or draining an electrically isolated component, such as a floating gate, and the information is recalled by determining if the isolated component is charged or not. Floating gate memory cells are typically provided with associated control gates, select gates, and erase gates, that are utilized in the storage, retrieval, and erasing of memory on the floating gate.

Finned field effect transistors, or FinFETs, are 3 dimensional devices manufactured on a fin overlying a substrate. The fin extends upwards from the substrate, and various electronic components are manufactured about the fin to produce the 3 dimensional structure. Three dimensional structures allow for high packing density with vertical scalability, and can also provide improved performance and/or reliability because the protruding fin provides more surface area than is available for planar devices in a similar area of the substrate. Non-volatile memory cells using floating gates as shoulders on fins have not been produced.

Accordingly, it is desirable to provide non-volatile memory cells on finned structures, and methods for producing the same. In addition, it is desirable to provide floating gate memory cells on fins, with associated control gates, select gates, and erase gates, and methods for producing such memory cells. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming a first fin overlying a substrate, where the first fin extends in a first direction, and the first fin has a first fin left end. A second fin is formed overlying the substrate, where the second fin extends in a second direction different than the first direction, and the second fin intersects the first fin at a fin intersection. A tunnel dielectric is formed adjacent to the first fin, and a floating gate is formed adjacent to the first fin such that the tunnel dielectric is between the floating gate and the first fin. An interpoly dielectric is formed adjacent to the floating gate, and a control gate is formed adjacent to the interpoly dielectric such that the interpoly dielectric is between the floating gate and the control gate. The control gate, interpoly dielectric, floating gate, and the tunnel dielectric are removed from over the first fin except for at a floating gate position between the first fin left end and the fin intersection.

In another embodiment, a method is provided for producing an integrated circuit. The method includes forming a first fin overlying a substrate, where the first fin extends in a first direction and includes a first fin left end. A drain is formed on the first fin left end. A second fin is formed overlying the substrate, where the second fin extends in a second direction different than the first direction, and the second fin intersects the first fin at a fin intersection. A floating gate is formed adjacent to the first fin at a floating gate position between the first fin left end and the fin intersection. A control gate is formed overlying the floating gate, and a select gate is formed overlying the first fin at a select gate position. The select gate position is between the first fin left end and the fin intersection point, and the select gate position is adjacent to the floating gate position.

An integrated circuit is provided in another embodiment. The integrated circuit includes a first fin overlying a substrate and extending in a first direction, where the first fin has a first fin left end. A second fin overlies the substrate and extends in a second direction different than the first direction, and the second fin intersects the first fin at a fin intersection point. A floating gate is positioned adjacent to the first fin between the first fin left end and the fin intersection point, and a control gate overlies the floating gate and the first fin. A select gate overlies the first fin adjacent to the floating gate and between the first fin left end and the fin intersection.

BRIEF DESCRIPTION OF THE DRAWINGS

The present embodiments will hereinafter be described in conjunction with the following drawing figures, wherein like numerals denote like elements, and wherein:

FIGS. 1A-17 illustrate an integrated circuit with a memory cell and methods fabricating the same in accordance with exemplary embodiments. In particular:

FIGS. 1A, 2, 3, 7 and 8 are perspective views;

FIGS. 4-6, 11, and 12 are sectional views along plane VV from FIG. 1A;

FIGS. 9, 10, 13, and 14 are sectional views along plane HH from FIG. 1A;

FIGS. 15 and 16 are perspective sectional views sectioned along a plane parallel with plane VV from FIG. 1A and along plane WW from FIG. 1A; and FIG. 17 is a perspective sectional view partially sectioned along plane WW from FIG. 1A.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Non-volatile memory cells using fins and methods for producing the same according to various embodiments are provided herein. The non-volatile memory cells include a floating gate formed as a shoulder adjacent to a first fin. A control gate is formed overlying the floating gate and the first fin, and a select gate is formed overlying the first fin adjacent to the floating gate and control gate. A second fin intersects the first fin at a fin intersection. The second fin is formed into a source line, the end of the first fin is formed into a drain, and the fin serves as a channel between the source line and the drain. The floating gate is encapsulated in insulating materials, so it can store a charge, and the memory function is performed by determining if a charge is stored on the floating gate. The three dimensional structure of the memory cell allows for reduced gate length and larger width, which improves packing density, vertical scalability, select gate drive current, and program and erase reliability over planar memory cells with floating gates. There are many embodiments for forming the various components of the memory cell, including polysilicon gates, replacement metal gates, gate first methods, gate last methods, silicon on insulator substrates, bulk substrates, and combinations thereof.

Figure 1A:
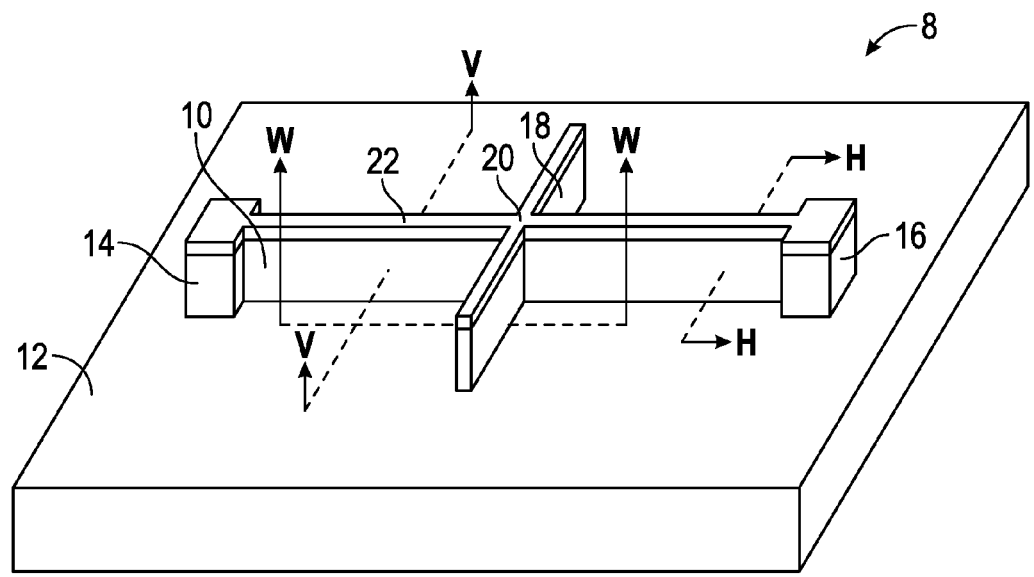

Reference is made to an exemplary embodiment illustrated in FIG. 1A. A portion of an integrated circuit 8 includes a first fin 10 formed overlying or from a substrate 12. As used herein, the term "overlying" means "over" such that an intervening layer may lie between the first fin 10 and the substrate 12, and "on" such the first fin 10 physically contacts the substrate 12. The substrate 12 is a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the semiconductor material is a silicon substrate. The silicon substrate may be a bulk silicon wafer (as illustrated in FIG. 1A) or may be a thin layer of silicon on an insulating layer (commonly known as silicon-on-insulator or SOI) that, in turn, is supported by a carrier wafer. FIG. 1A illustrates the formation of the first fin 10 on a bulk substrate.

The first fin 10 extends in a first direction, and terminates in a first fin left end 14 and a first fin right end 16. As used herein, the terms "left" and "right" are used to distinguish the two ends of the first fin 10, and are not intended to indicate direction or relative position of the ends of the first fin 10. A second fin 18 is also formed overlying the substrate 12, where the second fin 18 extends in a second direction different than the first direction. The second fin 18 intersects the first fin 10 at a fin intersection 20. In an exemplary embodiment, the first and second fins 10, 18 intersect at right angles, but the first and second fins 10, 18 may intersect at other angles in alternate embodiments. The first fin 10 can be used to form two memory cells, where the two memory cells are a mirror image of each other at the second fin 18. In many embodiments, the two memory cells formed on the first fin 10 form a unit cell, and the unit cell may be repeated many times to form an array of memory cells. The array of memory cells may be repeated to the left and/or right, to the top and/or bottom, and to the front and/or back in various embodiments.

In an exemplary embodiment, the first and second fins 10, 18 are formed by etching the substrate 12. A fin hard mask 22 is formed overlying the first and second fins 10, 18, such as by reacting ammonia and dichlorosilane in a low pressure chemical vapor deposition furnace to form a silicon nitride fin hard mask 22. A layer of photoresist (not shown) is used for patterning and forming the fin hard mask 22, which is used to form the first and second fins 10, 18, as understood by those skilled in the art. The photoresist may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations are removed with an organic solvent, and the photoresist remains overlying the other areas of the fin hard mask 22. Exposed portions of the fin hard mask 22 can then be selectively removed, such as with a dry reactive ion etch using silicon hexafluoride, while the fin hard mask 22 underlying the remaining photoresist remains in place. The remaining fin hard mask 22 protects the portion of the substrate 12 that becomes the first and second fins 10, 18 while exposed areas of the substrate 12 are anisotropically etched with an etchant selected to the material of the substrate 12 over the material of the fin hard mask 22. For example, a dry reactive ion etch with carbon tetrachloride is selective to a crystalline silicon substrate 12 over a silicon nitride fin hard mask 22. Many other etchants can be used in alternate embodiments, as understood by those skilled in the art, so the example described herein is merely exemplary and is not intended to limit the means of formation. Photoresists and hard masks may be used for patterning and forming many components of the integrated circuit 8, and repetitive discussion of this process is generally omitted to simplify and clarify this description.

Figure 1B:
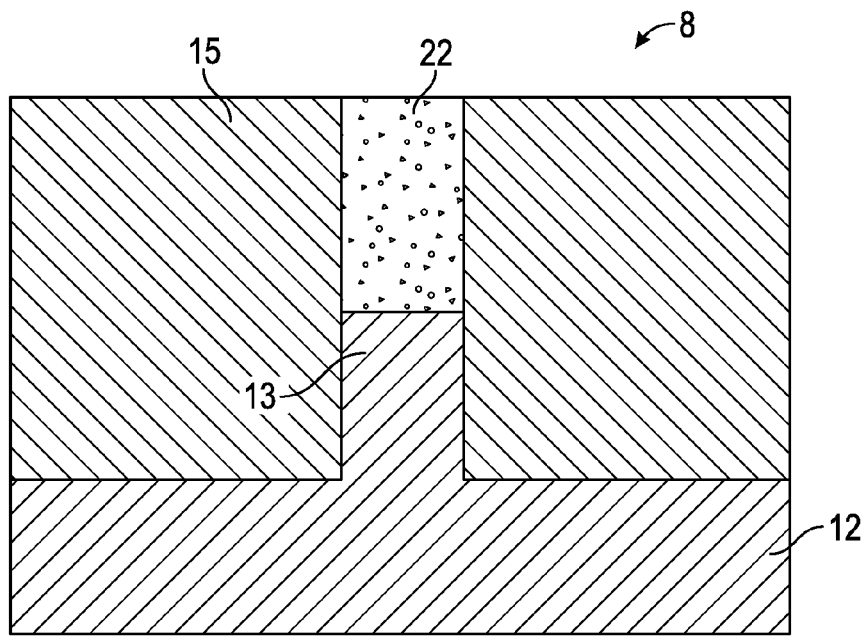
FIGS. 1B and 1C are sectional views along plane WW from FIG. 1A.
Figure 1C:
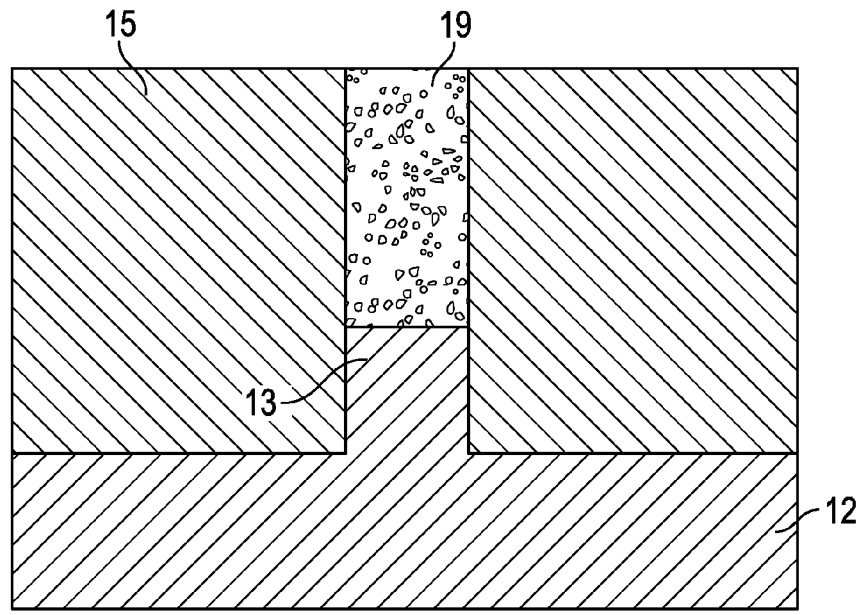

An alternate embodiment of forming the first and second fins 10, 18 is illustrated in FIGS. 1B and 1C, which are taken along plane WW from FIG. 1A, with continuing reference to FIG. 1A. In this embodiment, the first and second fins 10, 18 are formed by epitaxial growth, where FIGS. 1B and 1C illustrate a portion of the second fin 18, but the same process is used for the first fin 10. FIGS. 1B and 1C illustrate the use of a bulk substrate. When the first and second fins 10, 18 are formed by epitaxial growth, the composition of the first and second fins 10, 18 may be different than the substrate 12 in some embodiments. The fin hard mask 22 is formed as described above, but a fin base 13 is formed underlying the fin hard mask 22, as seen in FIG. 1B. A support layer 15 is formed adjacent to the fin base 13 and the fin hard mask 22, such as by depositing silicon oxide, and the surface of the support layer 15 is smoothed by chemical mechanical planarization to expose the top of the fin hard mask 22. Silicon oxide can be deposited using many techniques, such as chemical vapor deposition using silane and oxygen.

The fin hard mask 22 is then removed with an etchant selective to the material of the fin hard mask 22, as described above. An epitaxial second fin 19 and an epitaxial first fin (not illustrated) can then be deposited by epitaxial growth in the space previously occupied by the fin hard mask 22, as illustrated in FIG. 1C. In an exemplary embodiment, the epitaxial first fin and epitaxial second fin 19 are grown by vapor phase epitaxy using silicon tetrachloride and hydrogen gas, but other types of epitaxy can also be used, such as molecular beam epitaxy. Doping impurities of the desired type may be added to the source gas during the epitaxial growth, so the epitaxial first fin and epitaxial second fin 19 are formed with the desired dopant at the desired concentration. Different source gases can be used to modify the composition of the epitaxial first fin and epitaxial second fin 19, such as incorporating germanium by adding germane to the source gas. Epitaxial growth extends from the crystalline structure of the fin base 13, where the support layer 15 does not have a well-defined crystalline structure, so the epitaxial first fin and epitaxial second fin 19 are produced where the fin hard mask 22 was removed. In yet another embodiment, an epitaxial substrate is formed over a crystalline silicon substrate by blanket epitaxial growth, and a first epitaxial fin and a second epitaxial fin 19 are etched as described above with reference to FIG. 1A. The support layer 15 may be removed or partially removed using an etchant selective to the material of the support layer 15, such as a buffered hydrofluoric acid wet etch for embodiments where the support layer 15 is silicon oxide. The first epitaxial fin and the second epitaxial fin 19 can then be used in place of the first and second fins 10, 18 in the description below.

Figure 2:
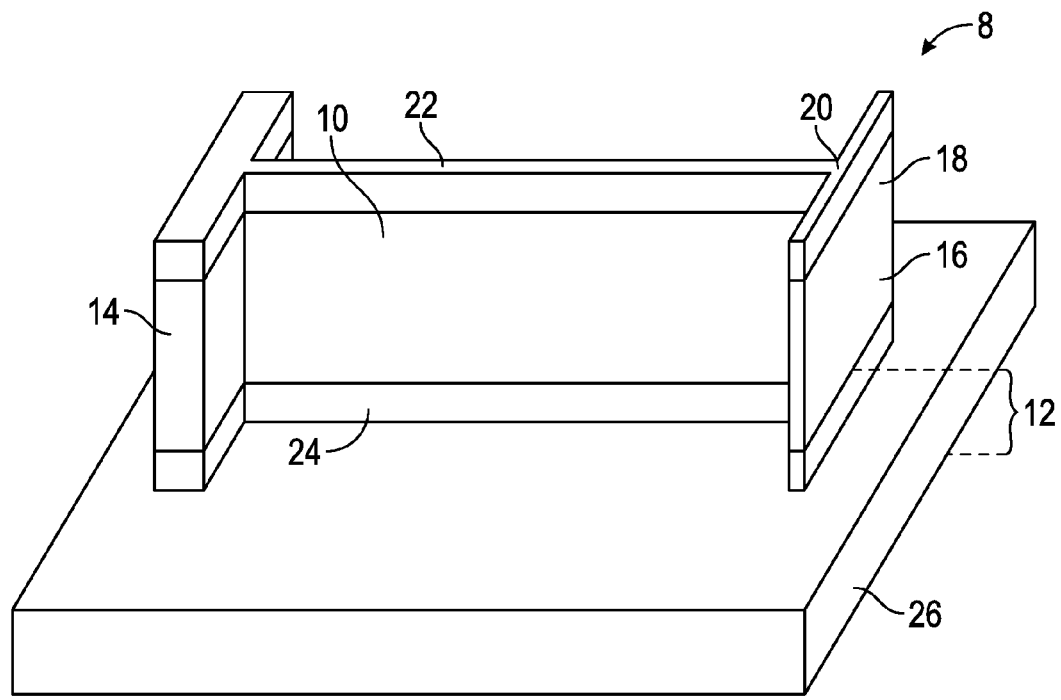
Figure 3:
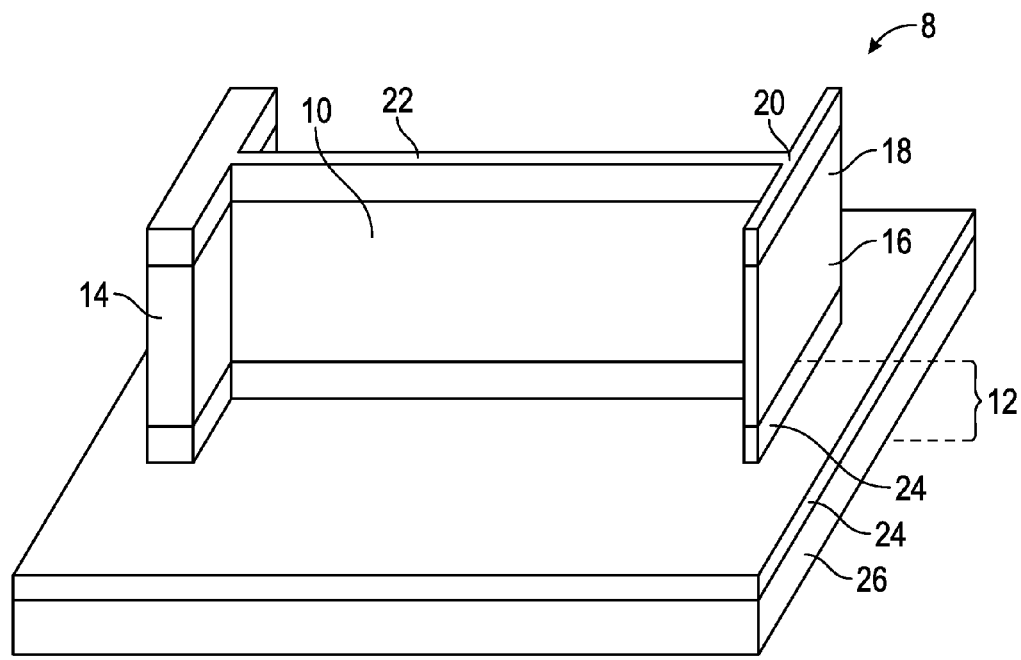

Yet another embodiment of forming the first and second fins 10, 18 is illustrated in FIGS. 2 and 3. In this embodiment, the substrate 12 includes a buried oxide 24, and the first and second fins 10, 18 extend into and through the buried oxide 24. As such, FIG. 2 represents the use of an SOI substrate, as described above. The buried oxide 24 can be etched after etching the first and second fins 10, 18, such as with a reactive ion etch using carbon tetrachloride in embodiments where the buried oxide 24 is silicon oxide. Substrates 12 with buried oxides 24 are commercially available, and often referred to as silicon on insulator (SOI) substrates 12, as mentioned above. As such, the base of the first and second fins 10, 18 are formed of the material of the buried oxide 24, and they rest on a carrier 26. In many embodiments, the carrier 26 is a part of the substrate 12, and is a semiconductor material. In the embodiment illustrated in FIG. 2, the fin intersection 20 is at the first fin right end 16. Another embodiment using an SOI substrate 12 is illustrated in FIG. 3, where the first and second fins 10, 18 are etched into the buried oxide 24, but not through the buried oxide 24, so the base of the first and second fins 10, 18 rest on a portion of the buried oxide 24. The embodiments illustrated in FIGS. 2 and 3 are more fully described below.

Figure 4:
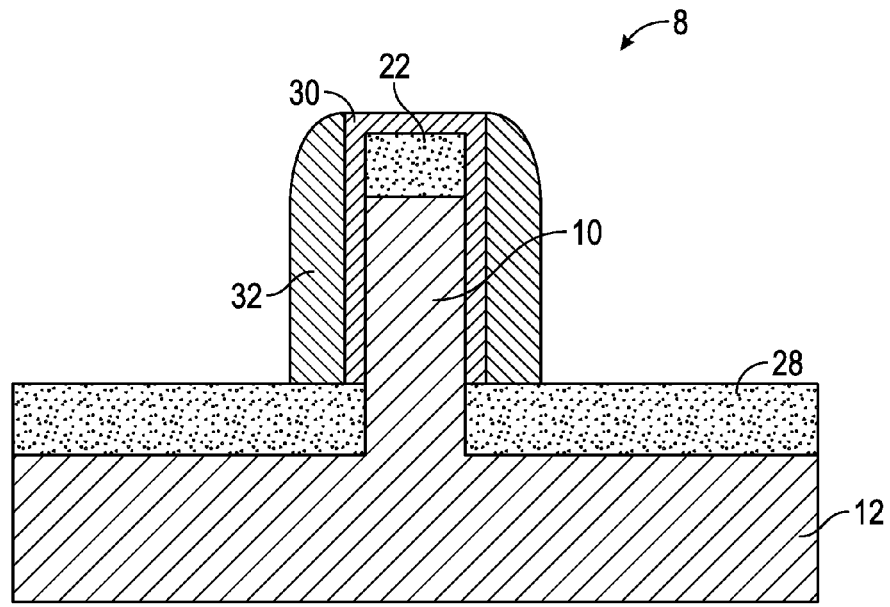

Reference is made to the exemplary embodiment in FIG. 4, with continuing reference to FIG. 1A, where FIG. 4 is a view along plane VV from FIG. 1A. FIG. 4 illustrates an embodiment on a bulk substrate 12, and FIG. 4 illustrates one embodiment of the process after the first and second fins 10, 18 have been formed, where FIGS. 1A-3 illustrated various processes of forming the first and second fins 10, 18. An isolation layer 28 is formed overlying the substrate 12 and adjacent to the first and second fins 10, 18, where the isolation layer 28 is an insulating material. In an exemplary embodiment, the insulating material is deposited overlying the first and second fins 10, 18 and overlying the substrate 12 adjacent to the first and second fins 10, 18. In some embodiments, there is a plurality of first fins 10, and the insulating material is deposited in the "valley" between adjacent first fins 10. The insulating material may be silicon oxide, and it may be deposited as a flowable oxide or by chemical vapor deposition using silane and oxygen. The insulating material overlying the first and second fins 10, 18, and the fin hard mask 22 is removed, such as with chemical mechanical planarization, and the insulating material is selectively etched to lower the surface of the isolation layer 28 to a desired level. A buffered hydrofluoric acid wet etch may be used to etch the isolation layer 28, but other etchants are also available as mentioned above. The isolation layer 28 may not be formed in embodiments using an SOI substrate 12, because the insulating layer of the SOI substrate 12 electrically isolates different fins.

A tunnel dielectric 30 is formed adjacent to the first fin 10. The tunnel dielectric 30 is silicon oxide in some embodiments, but other insulating materials are used in alternate embodiments. Silicon oxide can be deposited or grown in place. For example, silicon oxide can be deposited with chemical vapor deposition using silane and oxygen, or the silicon oxide can be grown in place on the exposed side surfaces of the first fin 10 with an oxidizing ambient at elevated temperatures, such as oxygen and water at about 900 degrees centigrade (° C.) to about 1,200° C. Excess tunnel dielectric 30, if present, can be left in place for later removal.

A floating gate 32 is formed adjacent to the first fin 10, with the tunnel dielectric 30 positioned between the floating gate 32 and the first fin 10. In an exemplary embodiment, the floating gate 32 is formed from polysilicon, which may be conformally deposited over the first fin 10 using low pressure chemical vapor deposition in a silane environment. Dopants can be included in the deposited polysilicon to provide the desired conductivity for the floating gate 32. The floating gate 32 can be formed as a shoulder adjacent to the first fin 10 with an anisotropic etch using a hydrogen bromide plasma with about 3 mass percent oxygen. The anisotropic etch removes the material of the floating gate 32 from horizontal surfaces, but leaves material adjacent to vertical surfaces as a shoulder. As such, the floating gate 32 is separated from the first fin 10 by the tunnel dielectric 30. At this point, the floating gate 32 is present along essentially all the side surfaces of the first and second fins 10, 18, so the three dimensional fins are surrounded by the floating gate 32.

Figure 5:
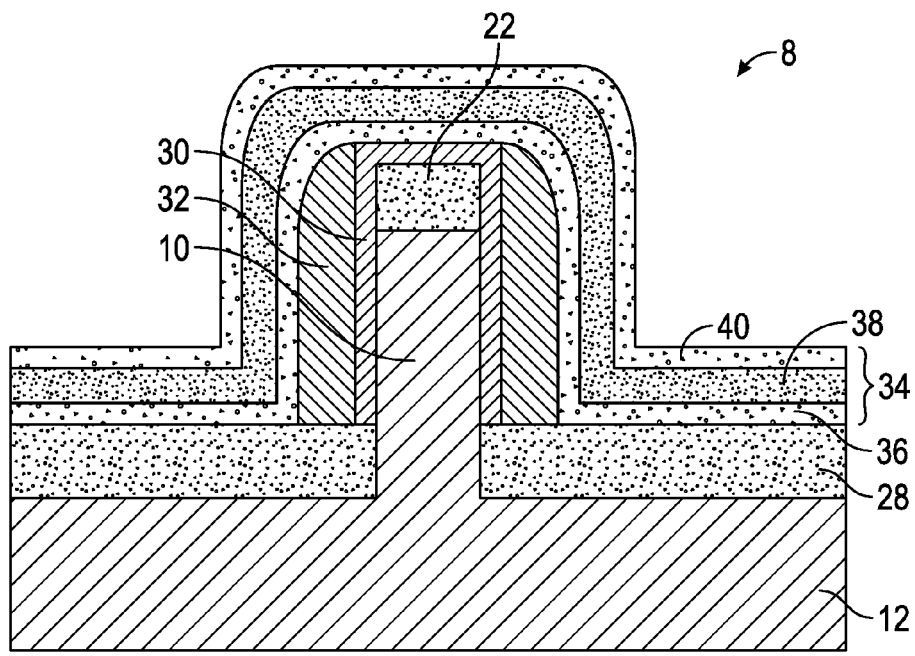

An interpoly dielectric 34 is formed overlying the floating gate 32 and adjacent to the first fin 10, as illustrated in an exemplary embodiment in FIG. 5. The interpoly dielectric 34 includes an insulating material, so the floating gate 32 is encased in the insulating materials of the isolation layer 28, the tunnel dielectric 30, and the interpoly dielectric 34. In embodiments where the tunnel dielectric 30 was formed by oxidizing the side surfaces of the first fin 10, the tunnel dielectric 30 may not extend adjacent to the fin hard mask 22 overlying the first fin 10, so the fin hard mask 22 may be part of the insulating materials encasing the floating gate 32. In alternate embodiments where the tunnel dielectric 30 was deposited, the tunnel dielectric 30 may extend beside and over the fin hard mask 22. In an exemplary embodiment, the interpoly dielectric 34 is formed from three layers of insulating materials, including a first oxide layer 36 overlying the floating gate 32, a nitride layer 38 overlying the first oxide layer 36, and a second oxide layer 40 overlying the nitride layer 38. The first and second oxide layers 36, 40 may be formed by chemical vapor deposition using silane and oxygen, and the nitride layer may be formed by low pressure chemical vapor deposition using ammonia and dichlorosilane. The interpoly dielectric 34 may also be a single layer (such as high K dielectrics like hafnium oxide or hafnium silicon oxynitride), two layers, or more than three layers in other embodiments. In many of the figures, the interpoly dielectric 34 is illustrated as a single layer for clarity despite the fact that it may be several layers. As those skilled in the art will understand, many of the components may include multiple layers in various embodiments, even though such components are illustrated as a single layer.

Figure 6:
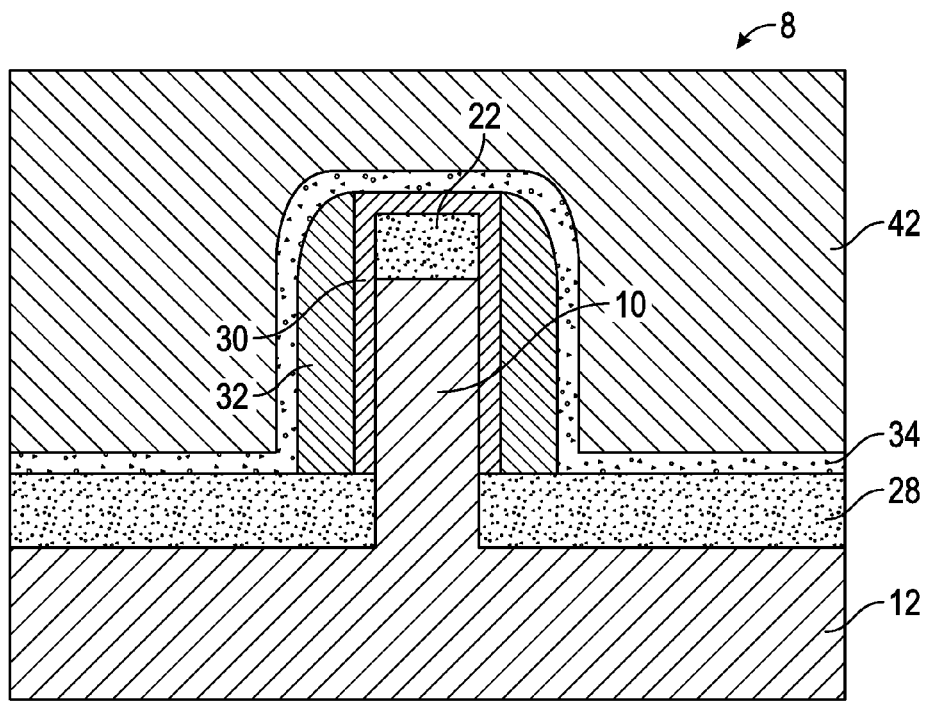

Referring to FIG. 6, a control gate 42 is formed overlying the interpoly dielectric 34. In an exemplary embodiment, the control gate 42 is formed from polysilicon, with dopant impurities such that the control gate 42 has the desired conductivity. Polysilicon may be deposited by low pressure chemical vapor deposition in a silane environment, with dopant impurities added as desired, as described above. In alternate embodiments, the control gate 42 may be formed from metal or other materials. In an exemplary embodiment, the control gate 42 is a replacement metal gate, where a dummy control gate (not illustrated) is initially formed and later etched and replaced with a metal gate. The dummy control gate remains in place at this point of the process in embodiments with a replacement metal gate. The dummy control gate is removed and the replacement metal gate is formed later in the process, such as after the formation of silicides and interlayer dielectrics, and after chemical mechanical planarization steps, as understood by those skilled in the art. The replacement metal gate may be formed of tungsten, aluminum, tantalum nitride, titanium nitride, or other metals in various embodiments. For example, an aluminum metal gate may be deposited by chemical vapor deposition using triisobutylaluminium.

Figure 7:
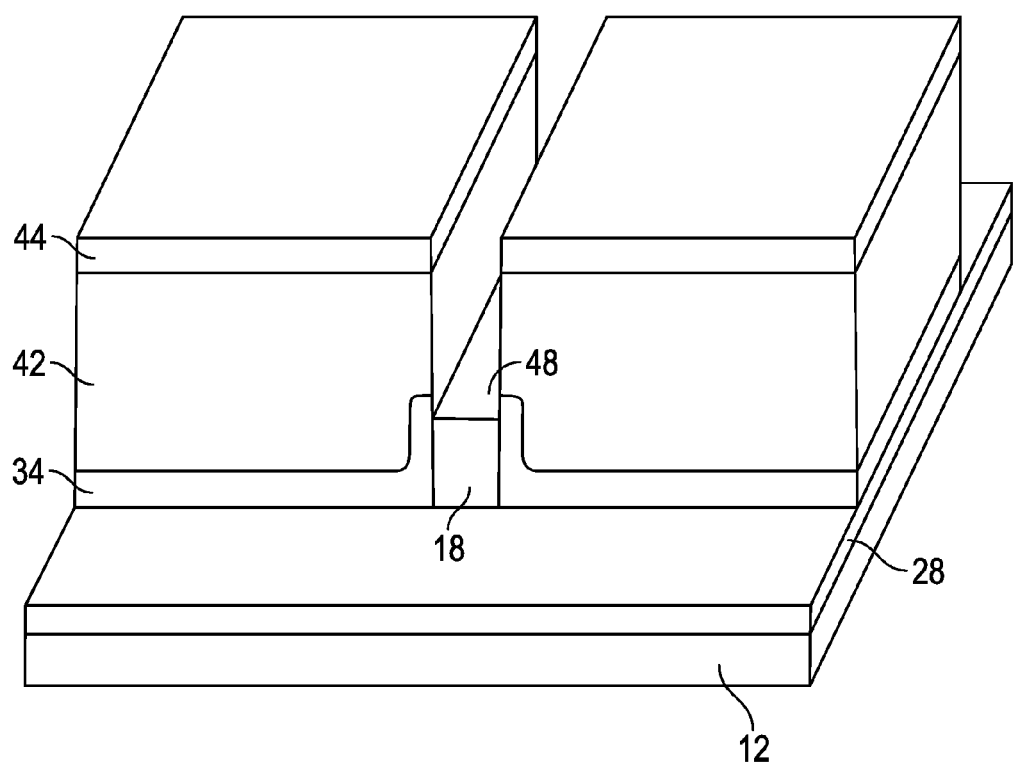

Reference is made to FIG. 7, with continuing reference to FIG. 6. A control gate hard mask 44 is formed overlying the control gate 42, where the control gate hard mask 44, the control gate 42, and the interpoly dielectric 34 are positioned over the entire first and second fin 10, 18 when the control gate hard mask 44 is deposited. In an exemplary embodiment, the control gate hard mask 44 is removed from over the second fin 18 but left overlying other structures, and a source line 48 is formed from the second fin 18. The control gate hard mask 44 over the second fin 18 is removed using photoresist and an etchant selective to the material of the control gate hard mask 44, such as a with a dry reactive ion etch using silicon hexafluoride for embodiments with a silicon nitride control gate hard mask 44. The control gate 42, interpoly dielectric 34, and optionally the fin hard mask 22 are also removed from over the second fin 18 using appropriate selective etches, so the second fin 18 is exposed. There are various embodiments for forming the source line 48 from the second fin 18. In one embodiment, the source line 48 is formed by implanting selected dopant ions into the second fin 18. The dopants may be implanted into the second fin 18 through the fin hard mask 22 in embodiments where the fin hard mask 22 was not removed. The dopants increase the conductivity of the material of the second fin 18, so the second fin 18 is used as the source line 48 and functions as the source with a drain described below. Portions of the integrated circuit 8 other than the second fin 18 may be protected from ion implantation by the remaining control gate hard mask 44. Alternatively, the source line 48 may be epitaxially grown (not illustrated) from the second fin 18. In an exemplary embodiment, the source line 48 is grown by vapor phase epitaxy using silicon tetrachloride and hydrogen gas, but other types of epitaxy can also be used, such as molecular beam epitaxy, and other components may be included in the source line 48, such as germanium. Doping impurities of the desired type are added to the source gas during the epitaxial growth, so the source line 48 is formed with the desired dopant at the desired concentration. Epitaxial growth extends from the existing crystalline structure of the second fin 18, but the control gate hard mask 44, the control gate 42, and the interpoly dielectric 34 are not crystalline so they do not support epitaxial growth.

Figure 8:
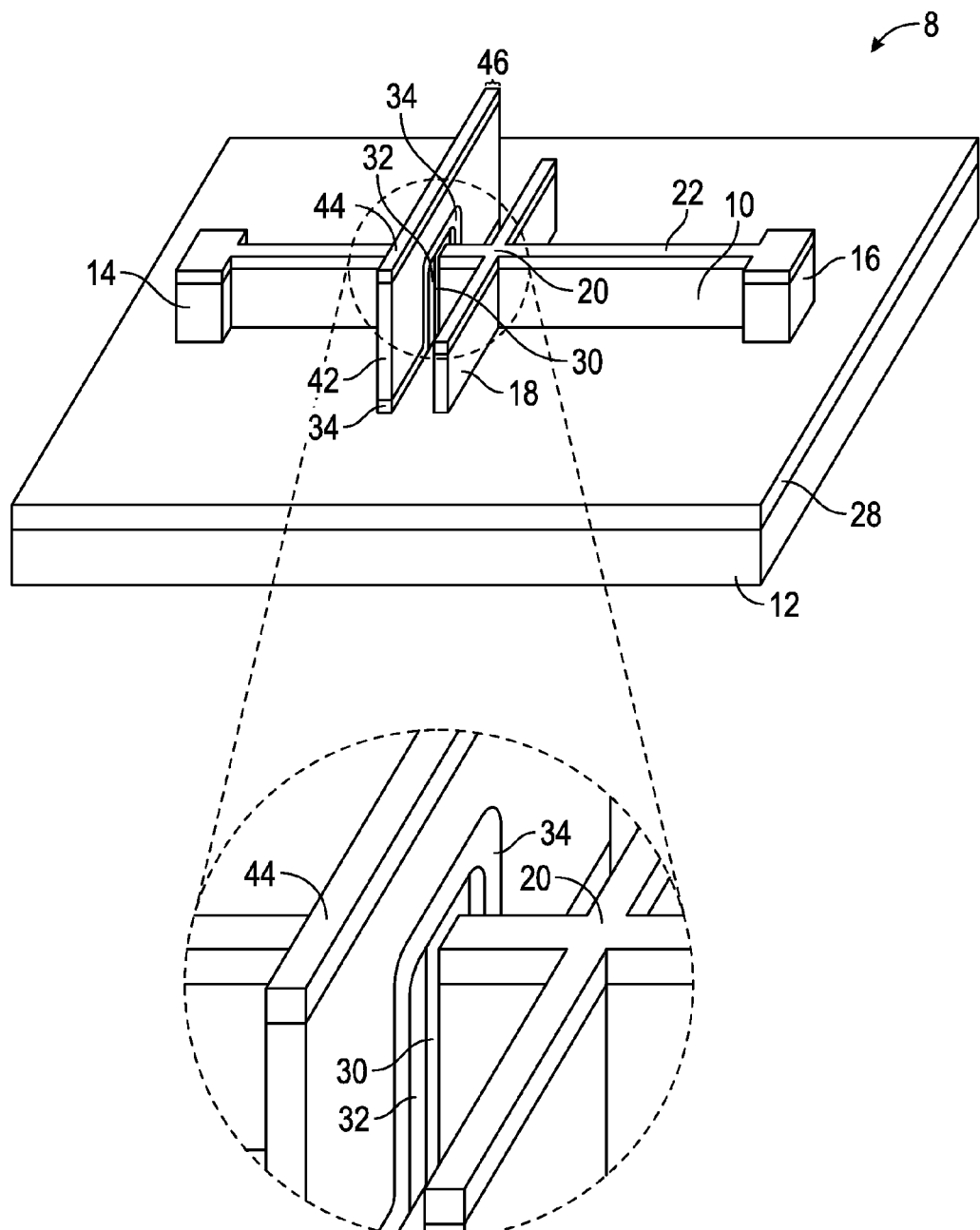
Figure 9:
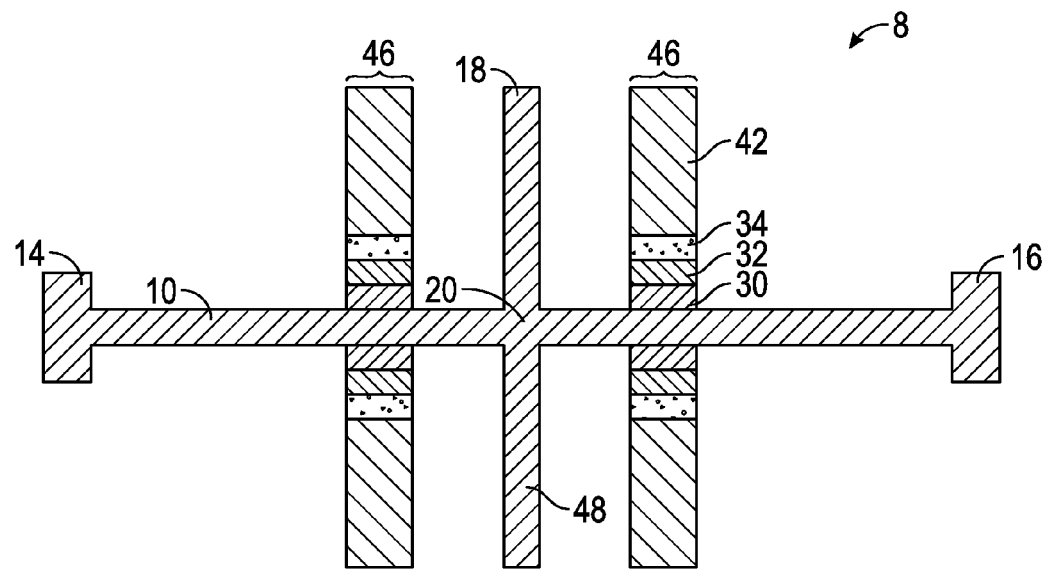

Reference is made to FIGS. 8 and 9, with continuing reference to FIGS. 6 and 7. FIG. 9 is a sectional view along plane HH from FIG. 1A, plane HH being parallel to the plane of the substrate 12. The control gate hard mask 44 is removed by selective etching, with the aid of photoresist as described above, such that the control gate hard mask 44 is only positioned over the control gate 42 at a floating gate position 46. As such, the control gate 42 and interpoly dielectric 34 remain over the entire first fin 10, but the control gate hard mask 44 is only present over the control gate 42 at the floating gate position. After removal of the control gate hard mask 44 from all areas except the floating gate position 46, the control gate 42, the interpoly dielectric 34, the floating gate 32, and the tunnel dielectric 30 are anisotropically etched to expose the first fin 10 at all locations except for the floating gate position 46, as illustrated in FIG. 8. The remaining control gate hard mask 44 protects the control gate and underlying structures from the anisotropic etch at the floating gate position 46. An additional hard mask (not illustrated) may be formed overlying the second fin 18, or selective etchants that do not attack the second fin 18 are used, such that the second fin 18 is not removed during the anisotropic etch. In embodiments where the fin hard mask 22 was left overlying the second fin 18, the fin hard mask 22 protects the second fin 18 from etching. The floating gate position 46 is between the fin intersection 20 and the first fin left end 14. In the embodiment illustrated in FIG. 8, there may be another floating gate position 46 between the fin intersection 20 and the first fin right end 16, as illustrated in FIG. 9. As such, the control gate 42 and floating gate 32 structure illustrated between the fin intersection 20 and the first fin left end 14 in FIG. 8 is duplicated essentially as a mirror image on the opposite side of the second fin 18 between the fin intersection 20 and the first fin right end 16.

Figure 10:
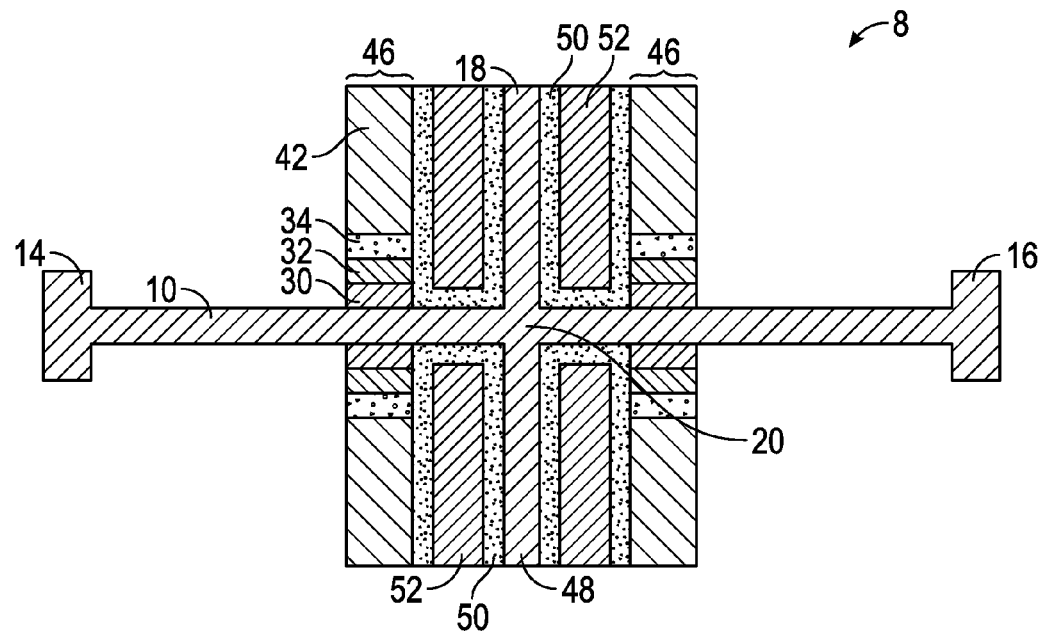

Referring to the exemplary embodiment in FIG. 10, an erase gate dielectric 50 is formed overlying the source line 48. The erase gate dielectric 50 is an insulating material, such as silicon oxide, that may be formed by chemical vapor deposition using silane and oxygen. As such, the erase gate dielectric 50 forms on exposed surfaces, so the erase gate dielectric 50 forms on any exposed substrate 12 between the second fin 18 and the control gate 42, as well as on the second fin 18, the side surface of the control gate 42, the side surface of the interpoly dielectric 34, the side surface of the floating gate 32, and the side surface of the tunnel dielectric 30. In an exemplary embodiment, deposition of the erase gate dielectric 50 is limited to desired areas of the integrated circuit 8 using photoresist and/or hard masks, as described above. The erase gate dielectric 50 may be deposited and then etched back to the desired thickness, as with other components described herein. In an exemplary embodiment, the erase gate dielectric 50 is about 10 to about 100 nanometers thick. An erase gate 52 is formed overlying the erase gate dielectric 50. In an exemplary embodiment, the erase gate 52 is polysilicon formed as described above, but the erase gate 52 may also be a replacement metal gate or other materials in other embodiments. A high K dielectric, such as hafnium oxide, may be used as the erase gate dielectric 50 for replacement metal gate embodiments. As used herein, a "high K dielectric" is a dielectric material with a dielectric constant (K) of about 10 or greater, where K is the ratio of a material's permittivity $\in$ to the permittivity of vacuum $\in_o$, so k=$\in$/$\in_o$. Since the dielectric constant is just a ratio of two similar quantities, it is dimensionless.

Figure 11:
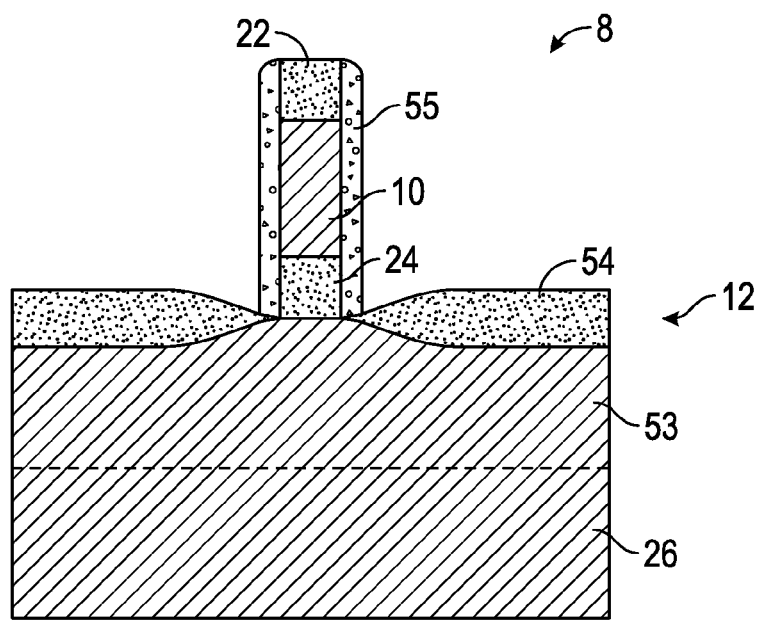

In alternative embodiments, a ground plane 53 is used to erase a charge stored on the floating gate 32, as illustrated in FIGS. 2, 3, and 10, with continuing reference to FIG. 10. FIG. 11 is a sectional view along plane VV from FIG. 1A. Electrons stored on the floating gate 32 can be induced to tunnel through a dielectric barrier to the erase gate 52 or the ground plane 53, so either component may be used to erase a charge stored on the floating gate 32. The carrier 26 underlying the buried oxide 24 of the substrate is used for the ground plane 53, and the ground plane 53 is optionally implanted with dopant impurities to increase conductivity. The ground plane 53 may be formed before the first and second fins 10, 18 are formed in some embodiments. In one exemplary embodiment illustrated in FIGS. 2 and 11, the buried oxide 24 was completely etched away overlying the substrate 12 in the space adjacent to the first fin 10, as described above. As such, the surface of the carrier 26 is exposed, where the carrier 26 may be monocrystalline silicon. A sacrificial liner 55 may be formed adjacent to the first fin 10, and the exposed surface of the carrier 26 is oxidized to form a ground plane dielectric 54. Alternatively, the ground plane dielectric 54 can be deposited, such as by chemical vapor deposition. The sacrificial liner 55 is sized such that the ground plane dielectric 54 extends to a desired distance adjacent to or underlying the first fin 10. In an exemplary embodiment, the sacrificial liner 55 is formed by depositing silicon oxide by chemical vapor deposition, and then the sacrificial liner 55 is formed as a shoulder on the first fin 10 with an anisotropic etch. The ground plane dielectric 54 is then formed by oxidizing the exposed surface of the carrier 26 adjacent to the first fin 10. An oxidizing ambient with oxygen and water at elevated temperatures, such as about 900° C. to about 1,200° C. can be used to oxidize the surface of the carrier 26 and form the ground plane dielectric 54. A pointed end of the ground plane dielectric 54 may aid electrons in tunneling from the floating gate 32 to the ground plane 53. The sacrificial liner 55 may be removed after the ground plane dielectric 54 is formed with an etch selective to the material of the sacrificial liner 55, or it may be incorporated into the tunnel dielectric 30 in other embodiments.

Figure 12:
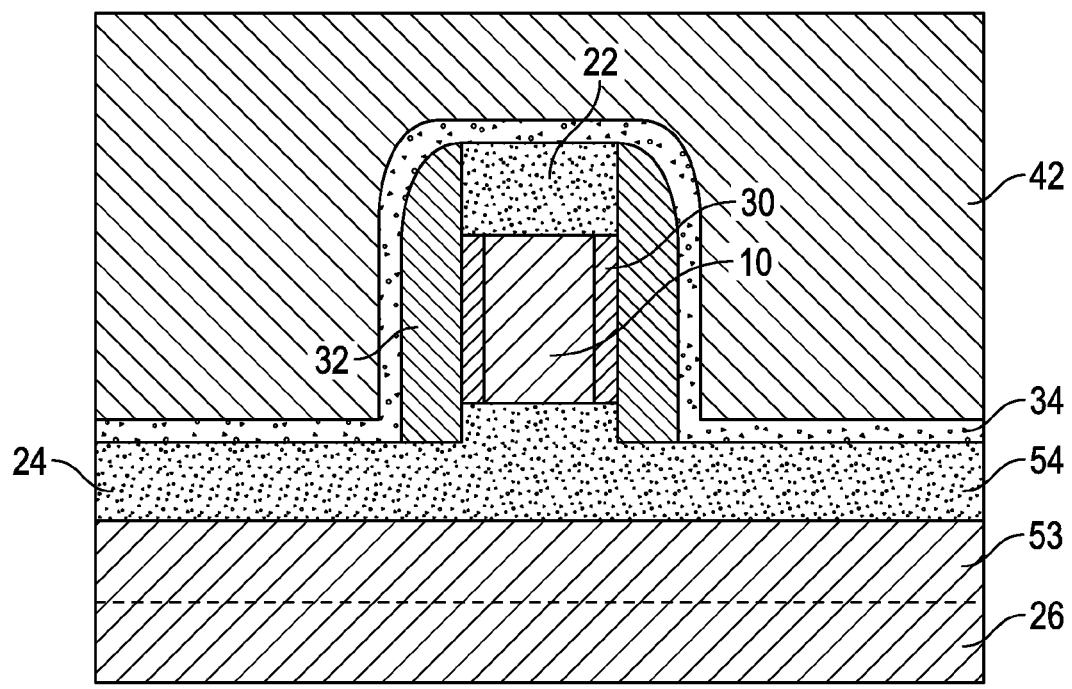

In another embodiment, as illustrated in FIGS. 3 and 12, the buried oxide 24 remains on the surface of the carrier 26 adjacent to the first fin 10. FIG. 12 is a sectional view along plane VV from FIG. 1A, where the tunnel dielectric 30 was formed by oxidizing the side surfaces of the first fin 10. When forming the first fin 10, the buried oxide 24 was not completely etched away overlying the substrate 12 to leave a layer of buried oxide 24 overlying the substrate 12 adjacent to the first fin 10, as described above. The buried oxide 24 serves as the ground plane dielectric 54. In the various embodiments where the carrier 26 serves as a ground plane 53, there may not be an erase gate 52 or an erase gate dielectric 50 overlying the source line 48. As such, a contact (not shown) may be connected to the ground plane 53 to induce the voltage necessary for electrons to tunnel through the buried oxide 24, and thereby erase any charge stored on the floating gate 32.

Figure 13:
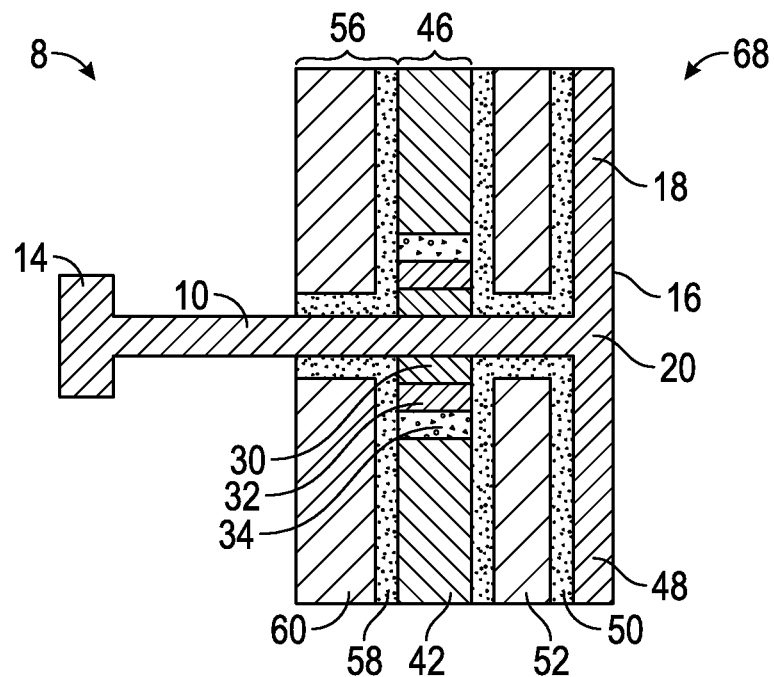

Reference is made to the exemplary embodiment in FIG. 13, with continuing reference to FIG. 8, where FIG. 13 is a sectional view along plane HH from FIG. 1A. The first fin right end 16 is at the fin intersection 20 in the exemplary embodiment illustrated in FIG. 13. Portions of the integrated circuit 8 are protected, such as with a hard mask, at locations other than a select gate position 56, where the hard mask may be the control gate hard mask 44 or other hard masks in various embodiments. The select gate position 56 is adjacent to the floating gate position 46 and overlying the first fin 10. In some embodiments, the select gate position 56 is immediately adjacent to the floating gate position 46 such that the select gate position 56 overlays the first fin 10 between the floating gate position 46 and the first fin left end 14. As such, the select gate position 56 is between the fin intersection 20 and the first fin left end 14. In some embodiments, there may be a plurality of select gate positions 56, with another select gate position 56 adjacent to the floating gate position 46 and between the fin intersection 20 and first fin right end 16, where the select gate positions 56 on opposite sides of the fin intersection 20 are essentially mirror images of each other.

In one embodiment, a select gate dielectric 58 is formed overlying the substrate 12 and the first fin 10 at the select gate position 56. In an exemplary embodiment, the select gate dielectric 58 is silicon oxide, which may be deposited by chemical vapor deposition using silane and oxygen. The select gate dielectric 58 overlies the substrate 12 and the first fin 10 at the select gate position 56, as mentioned above, and the select gate dielectric 58 also covers the exposed side surfaces of the control gate 42, the interpoly dielectric 34, the floating gate 32, and the tunnel dielectric 30 such that the select gate dielectric 58 forms an insulating barrier to the components at the floating gate position 46. A select gate 60 may be formed overlying the select gate dielectric 58, such as by depositing doped polysilicon and removing any overburden by chemical mechanical planarization, as described above. In an alternate embodiment, a dummy select gate (not illustrated) is deposited in place of the select gate dielectric 58 and the select gate 60, and the dummy select gate is later removed and replaced with a replacement metal gate. In this embodiment, a high K dielectric such as hafnium oxide or zirconium silicate may be deposited between the replacement metal gate and the first fin 10 and substrate 12. The replacement metal gate may be tungsten, aluminum, titanium nitride, tantalum nitride, or other materials. The high K dielectric and replacement metal gate, if present, are formed using methods well known to those skilled in the art. In all embodiments, there is a select gate dielectric 58 and a select gate 60 of one type or another at the select gate position 56.

Figure 14:
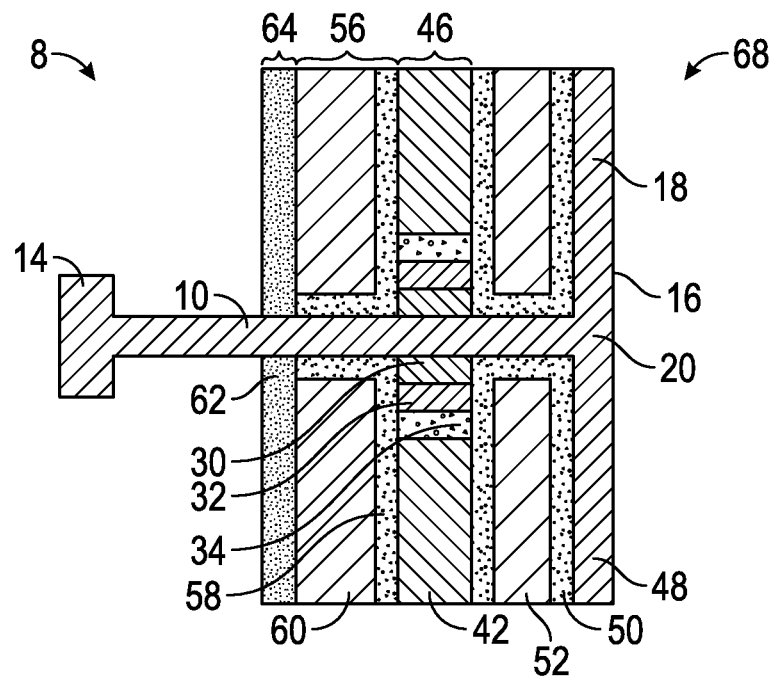

Reference is made to an exemplary embodiment illustrated in FIG. 14, with continuing reference to FIG. 8. A spacer 62 may be formed at a spacer position 64 overlying the first fin 10 and the substrate 12 and adjacent to the select gate position 56. Photoresist and a hard mask (not illustrated) can be used to isolate other areas of the integrated circuit 8, as described above. In some embodiments, excess material from the formation of the tunnel dielectric 30, the floating gate 32, the interpoly dielectric 34, and the control gate 42 may be present at the spacer position 64, and these materials are anisotropically etched away from the spacer position 64 if present. An insulating material is deposited in the spacer position 64 to form the spacer 62. In an exemplary embodiment, the spacer 62 includes silicon oxide deposited by chemical vapor deposition using silane and oxygen, but the spacer 62 may also be silicon nitride, silicon oxynitride, or a wide variety of other insulating materials. In some embodiments, the material for the spacer 62 may be blanket deposited over the integrated circuit 8, and then anisotropically removed to leave the spacer 62 as a shoulder of the material in the select gate position 56.

Figure 15:
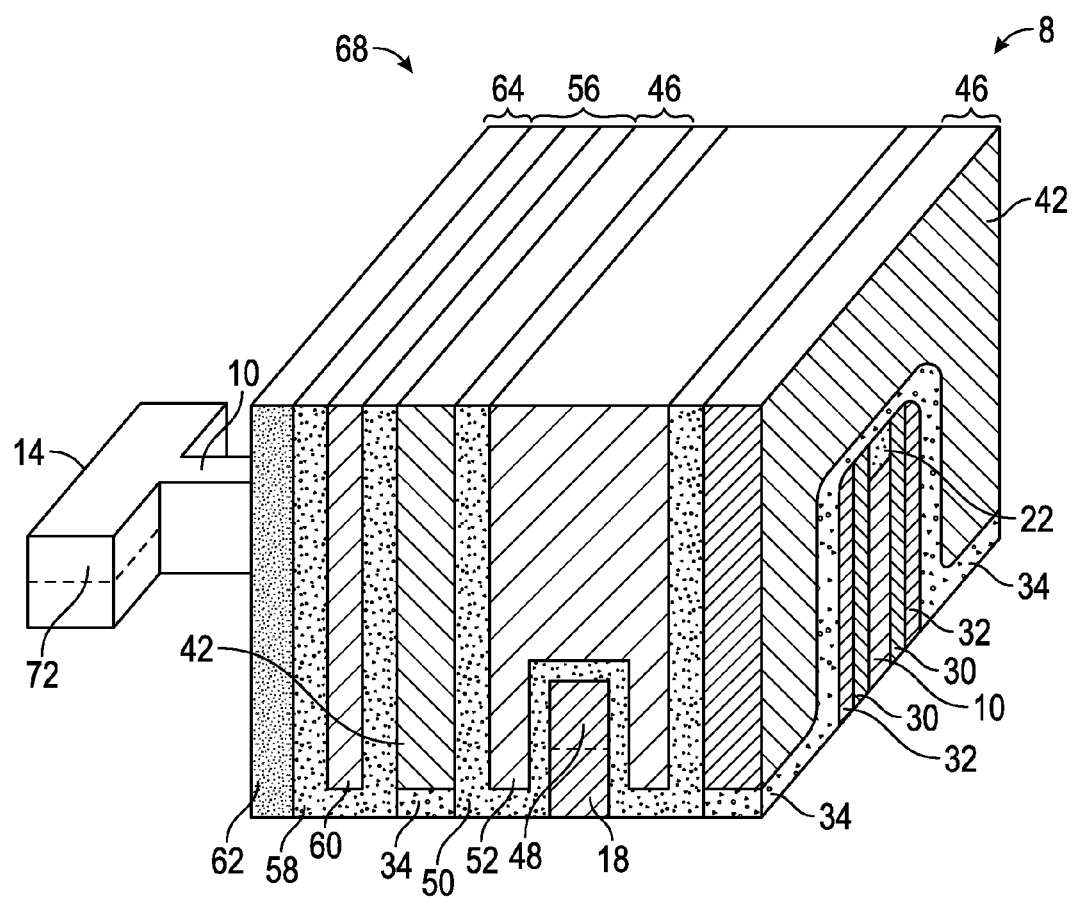

The first fin left end 14 is made into a drain 72, as illustrated in an exemplary embodiment in FIG. 15, where the integrated circuit 8 is sectioned along a plane parallel with plane VV from FIG. 1A in a floating gate position 46 to the right of the second fin 18, and where FIG. 15 is also sectioned along plane WW from FIG. 1A. In FIG. 15, the select gate 60 and select gate dielectric 58 were formed as a replacement metal gate, as indicated by the "U" shaped select gate dielectric 58 in the select gate dielectric position 56. The first fin right end (not illustrated in FIG. 13) may also be formed into a drain 72 in the same manner as the first fin left end 14 in some embodiments. The first fin left end 14 may be implanted with dopant ions to increase conductivity so it will function as a drain 72 in some embodiments, but in other embodiments the drain 72 at the first fin left end 14 is epitaxially grown with the desired dopants. The first fin left end 14 may optionally be etched prior to epitaxial growth to control the height of the drain 72 after the epitaxial growth. In some embodiments, a silicide is formed on the drain 72, as well as other locations where electrical contacts will be made. The silicide can be formed by depositing a thin layer of metal on the surfaces where contacts will be made, such as by sputtering or chemical vapor deposition, and the silicide is formed by a subsequent anneal. In an exemplary embodiment, nickel (Ni) is deposited and then annealed at a first temperature of about 240° C. to about 320° C. for about 10 to about 40 seconds, followed by a second anneal at about 400° C. to about 500° C. for about 20 to about 40 seconds. Other metals can be used, and the annealing process is adjusted for the selected metal. A wet etch can then be used to remove the metal overburden, which does not react with materials other than silicon. For example, nickel can be selectively etched with a mixture of nitric acid, acetic acid, and sulfuric acid. The source line 48 and the drain 72 are annealed, and an interlayer dielectric (not shown) may be deposited overlying the integrated circuit 8. In an exemplary embodiment, the source line 48 and the drain 72 are annealed before the silicide is formed, and the replacement metal gate illustrated for the select gate 60 (as well as any other replacement metal gates that may be present) is formed after the silicide is formed, and after an interlayer dielectric (not illustrated) is formed.

Figure 16:
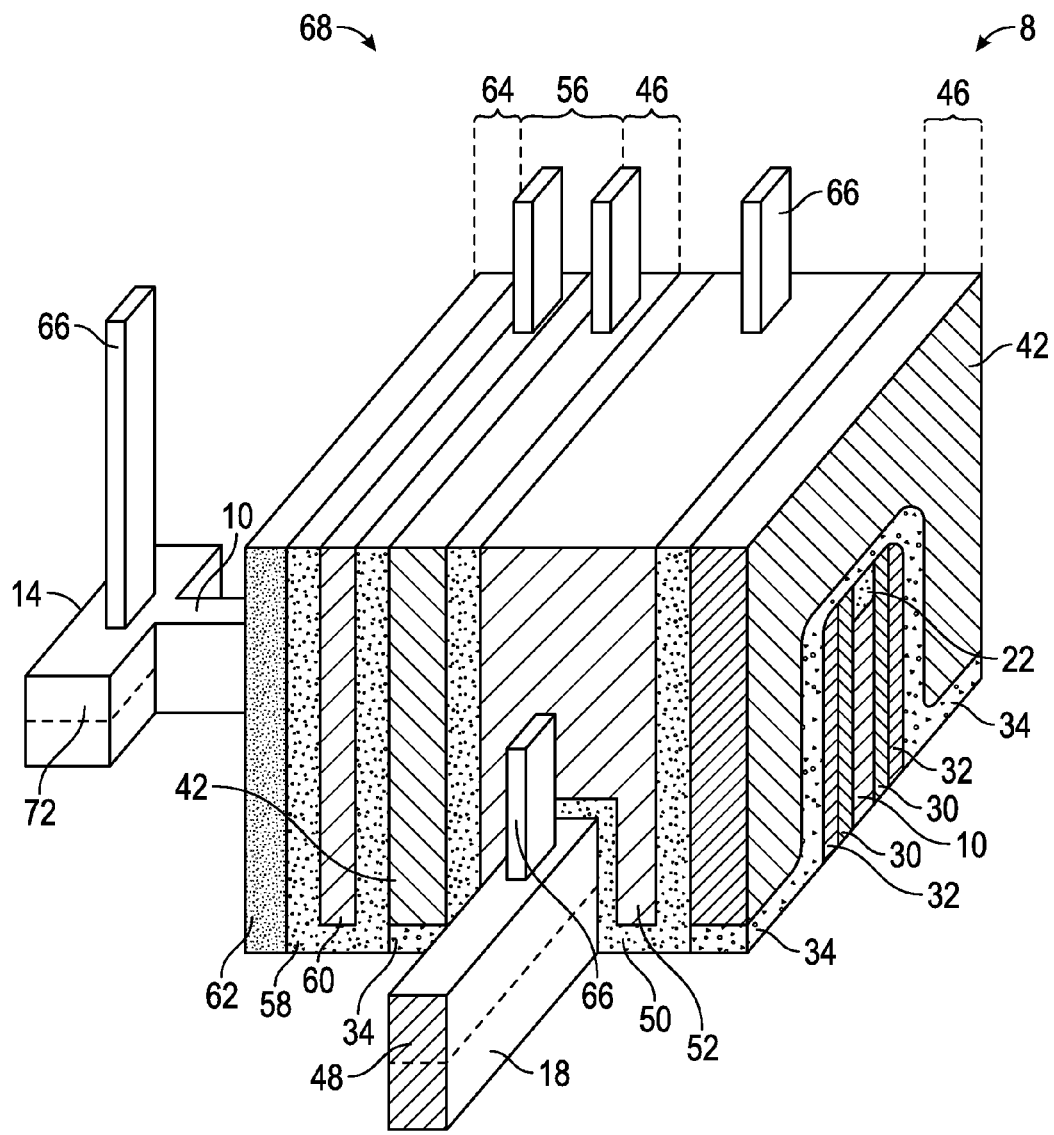
Figure 17:
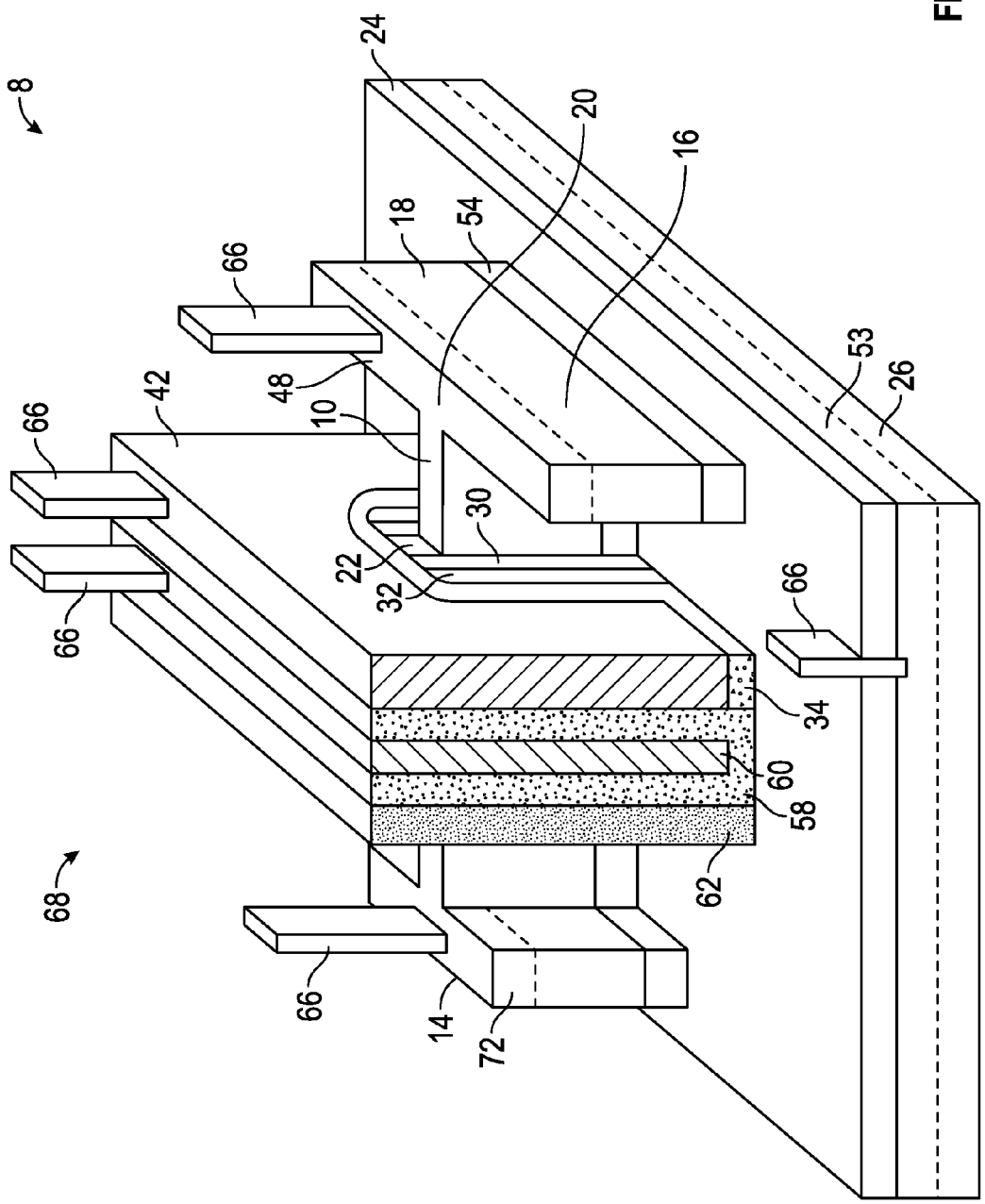

A plurality of contacts 66 are formed through the interlayer dielectric (not illustrated) using processes well known to those skilled in the art, as illustrated in FIG. 16. The contacts 66 may form electrical connections with the drain 72 at the first fin left end 14 and/or the first fin right end (not illustrated in FIG. 16), the source line 48, the erase gate 52, the control gate 42, and the select gate 60. In embodiments where the erase gate 52 is replaced by the ground plane, a contact 66 makes electrical connection with the ground plane, as illustrated in FIG. 17. FIG. 17 illustrates an embodiment where the first fin right end 16 is at the fin intersection 20, as described above, where the select gate 60, the control gate 42, and the spacer 62 portion of FIG. 17 are sectioned along plane WW from FIG. 1A. In the embodiment illustrated in FIG. 17, a second spacer 62 is omitted for clarity, where the second spacer is positioned between the second fin 18 and the control gate 42. The first fin 10 serves as a channel between the drain 72 at the first fin left end 14 and the source line 48, where the floating gate 32, control gate 42, and select gate 60 are positioned adjacent to the first fin 10 so the assembled components form a memory cell 68 that functions somewhat similar to a SuperFlash Cell. In some embodiments, as illustrated in FIG. 16, the first fin 10 includes two memory cells 68, one on each side of the second fin 18, where the two memory cells 68 share a common source line 48 and erase gate 52 or ground plane.

The integrated circuit 8 includes many other electronic components (not illustrated) that are used to operate the memory cell 68, such as sense amplifiers, high and medium voltage supply sources, drivers, etc. These electronic components are manufactured and connected to the memory cell 68 using methods and techniques well known to those skilled in the art. The various components discussed above may be produced in many different orders and configurations. For example, any one or more of the control gate 42, the select gate 60, and the erase gate 52 may be formed from doped polysilicon, metals, other conductive materials, or combinations thereof. The ground plane 53 may be substituted for the erase gate 52, and the memory cell 68 may include one or a plurality of floating gate positions 46 (and associated components) for each source line 48. The order of production can be varied as well, such as gate first or gate last options, replacement metal gate options, simultaneous formation of different gates, formation of the floating gate 32 and control gate 42 after the select gate 60 and erase gate 52, etc. In a similar manner, any one or more of the erase gate dielectric 50, interpoly dielectric 34, tunnel dielectric 30, select gate dielectric 58, ground plane dielectric 54, and spacer 62 may be formed from a wide variety of insulating materials, include silicon oxide, silicon nitride, silicon oxynitride, high K dielectric materials, other insulating materials, or combinations thereof. The order of production of the various dielectrics can also be varied, similar to the different gates. The memory cell 68 may be included in a bank of memory cells 68, and incorporated into the integrated circuit 8, as understood by those skilled in the art.

The memory cell 68 is operated by manipulating the voltage to the drain 72, the select gate 60, the control gate 42, the erase gate 52, and the source line 48, and by reading the current resulting from the manipulations. In some embodiments, the drain 72 is connected to a bitline, and the select gate 60 is connected to a wordline (not illustrated), as understood by those skilled in the art. The following description is for "N" type memory cells 68, but "P" type memory cells can also be used with reversed polarities. The following table illustrates an exemplary embodiment for the voltages used for various actions for a memory cell 68.

| Voltages for Operation | | | |
|---|---|---|---|
| | Read | Write | Erase |
| Select gate (60) | 1.2 | 0.8-1.2 | Ground |
| Drain (72) | 0.5 | Ground | Ground |
| Source Line (48) | Ground | 5 | Ground |
| Control Gate (42) | 1.5 | 9 | Ground |
| Erase Gate (52) | 0 | 0 | 13 to 14 |

Writing means depositing an electrical charge on the floating gate 32. Electrical charge can be deposited or cleared from the floating gate 32 using Fowler-Nordheim tunneling and hot-carrier injection, similar to planar floating gate memory cells. In an exemplary embodiment, this is accomplished by applying a voltage of about 9 volts to the control gate 42 while applying a voltage of about 5 volts to the source line 48. The drain 72 is grounded, and a channel area of the first fin 10 between the drain 72 and the source line 48 is also electrically "on," due to the small charge on the select gate 60, so electrons can travel through the channel area of the first fin 10. Electrons and holes are generated in the drain 72, and the electrons move through the channel area of the first fin 10 towards the voltage of the source line 48, which is acting as a source. The holes travel in the direction of the drain 72. The floating gate 32 is programmed by a process called source side injection. The electrons travelling through the channel area of the first fin 10 toward the source line 48 are injected onto the floating gate 32 across the tunnel dielectric 30. The voltage of about 9 volts on the control gate 42 provides enough energy (about 3.2 electron volts) for the electrons to inject across the tunnel dielectric 30 and onto the floating gate 32 at the region between the select gate 60 and the floating gate 32 by momentum transfer. When the write voltages are terminated, the electrons on the floating gate 32 no longer have a sufficient voltage to tunnel through the tunnel dielectric 30, so the floating gate 32 maintains a charge. The memory cell 68 is non-volatile, because the floating gate 32 maintains a charge even when the memory cell 68 is de-powered.

The erase operation can be done with very little active current, such as a total current in the nano amp range due to the nature of the tunneling process. A voltage range of about 13 to about 14 volts is applied to the erase gate 52 while the source line 48 and the drain 72 are grounded. This erases the stored information by providing sufficient charge for the electrons on the floating gate 32 to tunnel through the tunnel dielectric 30 and discharge from the floating gate 32 onto the control gate 42. The select gate 60 and the control gate 42 may also be grounded during the erase operation.

The memory cell 68 is read by applying a voltage of about 1.5 volts to the control gate 42, and a voltage of about 1.2 volts to the select gate 60. The source line 48 is grounded, so it serves as a source, and the drain 72 is charged to about 0.5 volts. If there is a charge stored on the floating gate 32, the threshold voltage is increased and very little current flows between the source line 48 and the drain 72. For example, a current of less than about one nano amp indicates a charge is stored on the floating gate 32. This is read as a "0". If there is no charge stored on the floating gate 32, the threshold voltage is lower and much more current flows between the source line 48 and the drain 72. For example, a current of about one micro amp or more indicates no charge is stored on the floating gate 32. This is read as "1". Sense amplifiers (not shown) determine the amount of current, and therefore determine if a "0" or a "1" is read.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming a first fin overlying a substrate, wherein the first fin extends in a first direction, and wherein the first fin comprises a first fin left end;
    forming a second fin overlying the substrate, wherein the second fin extends in a second direction different than the first direction, and wherein the second fin intersects the first fin at a fin intersection;
    forming a tunnel dielectric adjacent to the first fin;
    forming a floating gate adjacent to the first fin such that the tunnel dielectric is positioned between the floating gate and the first fin;
    forming an interpoly dielectric adjacent to the floating gate;
    forming a control gate adjacent to the interpoly dielectric such that the interpoly dielectric is positioned between the floating gate and the control gate; and
    removing the control gate, the interpoly dielectric, the floating gate, and the tunnel dielectric from over the first fin except for at a floating gate position, wherein the floating gate position is between the first fin left end and the fin intersection.

2. The method of claim 1 further comprising:
    forming a select gate overlying the first fin at a select gate position, wherein the select gate position is adjacent to the floating gate position.

3. The method of claim 2 wherein:
    forming the floating gate adjacent to the first fin comprises forming a plurality of floating gates adjacent to the first fin at a plurality of floating gate positions, wherein the plurality of floating gate positions comprise the floating gate position between a first fin right end and the fin intersection; and
    forming the select gate adjacent to the first fin comprises forming a plurality of select gates adjacent to the first fin at a plurality of select gate positions, wherein the plurality of select gate positions comprise the select gate position between the first fin right end and the fin intersection.

4. The method of claim 2 further comprising:
    forming a select gate dielectric overlying the first fin at the select gate position, wherein the select gate dielectric is positioned between the select gate and the first fin, the select gate dielectric is positioned between the floating gate and the select gate, and the select gate dielectric is positioned between the control gate and the select gate.

5. The method of claim 2 further comprising:
    forming a spacer overlying the first fin and adjacent to the select gate position, wherein the spacer is positioned between the select gate and the first fin left end.

6. The method of claim 1 further comprising:
    forming an erase gate dielectric overlying the second fin; and
    forming an erase gate overlying the erase gate dielectric.

7. The method of claim 1 wherein forming the first fin comprises etching the first fin into a buried oxide underlying the substrate, wherein the buried oxide overlies a carrier, the method further comprising:
    providing a ground plane dielectric underlying the first fin, wherein the ground plane dielectric overlies the carrier; and
    forming a contact to the carrier.

8. The method of claim 1 wherein forming the interpoly dielectric comprises forming a first oxide layer, a nitride layer, and a second oxide layer, and wherein the nitride layer is positioned between the first oxide layer and the second oxide layer.

9. The method of claim 1 wherein forming the second fin comprises forming the second fin such that the fin intersection is at a first fin right end.

10. A method of producing an integrated circuit comprising:
    forming a first fin overlying a substrate, wherein the first fin extends in a first direction and wherein the first fin comprises a first fin left end;
    forming a drain on the first fin left end;
    forming a second fin overlying the substrate, wherein the second fin extends in a second direction different than the first direction, and wherein the second fin intersects the first fin at a fin intersection;
    forming a floating gate adjacent to the first fin at a floating gate position between the first fin left end and the fin intersection;
    forming a control gate overlying the floating gate and the first fin; and
    forming a select gate overlying the first fin at a select gate position, wherein the select gate position is between the first fin left end and the fin intersection, and wherein the select gate position is adjacent to the floating gate position.

11. The method of claim 10 further comprising:
    forming an erase gate dielectric overlying the second fin, wherein the erase gate dielectric is adjacent to the floating gate and the control gate; and
    forming an erase gate overlying the erase gate dielectric such that the erase gate dielectric is positioned between the erase gate and the floating gate, and the erase gate dielectric is positioned between the erase gate and the control gate.

12. The method of claim 10 wherein forming the first fin comprise etching the substrate and a buried oxide underlying the substrate to form the first fin, wherein a carrier is positioned underlying the buried oxide, the method further comprising:
    providing a ground plane dielectric overlying the carrier; and
    forming a ground plane contact to the substrate.

13. The method of claim 10 further comprising:
    forming a tunnel dielectric between the floating gate and the first fin.

14. The method of claim 10 further comprising:
    forming an interpoly dielectric between the floating gate and the control gate.

15. The method of claim 14 wherein forming the interpoly dielectric comprises forming a first oxide layer, a nitride layer, and a second oxide layer, and wherein the nitride layer is positioned between the first oxide layer and the second oxide layer.

16. The method of claim 10 further comprising:
forming a select gate dielectric between the first fin and the select gate, wherein the select gate dielectric is also positioned between the select gate and the floating gate and the select gate dielectric is positioned between the select gate and the control gate.

17. The method of claim 10 wherein:
forming the floating gate adjacent to the first fin comprises forming a plurality of floating gates adjacent to the first fin at a plurality of floating gate positions, wherein the plurality of floating gate positions comprise the floating gate position between a first fin right end and the fin intersection; and
forming the select gate adjacent to the first fin comprises forming a plurality of select gates adjacent to the first fin at a plurality of select gate positions, wherein the plurality of select gate positions comprise the select gate position between the first fin right end and the fin intersection.

18. The method of claim 17 wherein forming the second fin comprises forming the second fin such that the fin intersection is at the first fin right end.

19. The method of claim 10 further comprising:
forming a spacer adjacent to the select gate such that the spacer is positioned between the select gate and the first fin left end, and wherein the spacer overlies the first fin.

* * * * *